US012598834B2

(12) United States Patent
Zahn et al.

(10) Patent No.: US 12,598,834 B2
(45) Date of Patent: Apr. 7, 2026

(54) METHOD AND DEVICE FOR PRODUCING SOLAR PANELS

(71) Applicant: M10 Solar Equipment GmbH, Freiburg (DE)

(72) Inventors: Philipp Donatus Martin Zahn, Freiburg (DE); Günter Schneidereit, Freiburg (DE); Dominique Jehl, Rhinau (FR)

(73) Assignee: M10 Solar Equipment GmbH, Freiburg (DE)

( * ) Notice: Subject to any disclaimer, the term of this patent is extended or adjusted under 35 U.S.C. 154(b) by 438 days.

(21) Appl. No.: 18/280,504

(22) PCT Filed: Dec. 21, 2021

(86) PCT No.: PCT/EP2021/087147
§ 371 (c)(1),
(2) Date: Sep. 6, 2023

(87) PCT Pub. No.: WO2022/189030
PCT Pub. Date: Sep. 15, 2022

(65) Prior Publication Data
US 2024/0154055 A1      May 9, 2024

(30) Foreign Application Priority Data
Mar. 11, 2021    (DE) ........................ 102021105986.0

(51) Int. Cl.
*H10F 71/00*        (2025.01)
*H10F 19/90*        (2025.01)

(52) U.S. Cl.
CPC ....... *H10F 71/1375* (2025.01); *H10F 19/902* (2025.01)

(58) Field of Classification Search
CPC .... H10F 71/1375; H10F 19/902; H10F 71/00; H10F 19/00; Y02E 10/50; H01L 31/18; H01L 31/188; H01L 31/042; H01L 31/0504
See application file for complete search history.

(56) References Cited

U.S. PATENT DOCUMENTS

| | | | | |
|---|---|---|---|---|
| 12,439,723 B2* | 10/2025 | Zahn | ..................... | H10F 19/902 |
| 2015/0349167 A1* | 12/2015 | Morad | .................. | H10F 19/804 |
| | | | | 136/251 |
| 2016/0163912 A1* | 6/2016 | Gonzalez | ............ | H10F 71/1375 |
| | | | | 118/712 |
| 2016/0163914 A1* | 6/2016 | Gonzalez | .............. | H10F 19/908 |
| | | | | 156/60 |
| 2019/0058436 A1 | 2/2019 | Atchley et al. | | |
| 2024/0162369 A1* | 5/2024 | Zahn | ........................ | H10F 71/00 |

FOREIGN PATENT DOCUMENTS

| | | |
|---|---|---|
| CN | 104600141 | 4/2018 |
| DE | 20220444 | 9/2003 |
| DE | 102008046327 | 3/2010 |

(Continued)

*Primary Examiner* — Earl N Taylor
(74) *Attorney, Agent, or Firm* — Volpe Koenig

(57) ABSTRACT

Improvements in the technical field of the production of solar modules, including a method for producing solar modules (2) in which at least two or more rows (4) of photovoltaic cells (3) are co-fed to a cell-fitting operation for a solar module (2).

18 Claims, 3 Drawing Sheets

(56) References Cited

FOREIGN PATENT DOCUMENTS

| | | |
|---|---|---|
| DE | 202008012449 | 4/2010 |
| DE | 102008031279 A1 | 5/2010 |
| DE | 102010016975 | 1/2011 |
| DE | 102013010447 | 12/2014 |
| JP | 2004111464 A | 4/2004 |
| JP | 2011249416 A | 12/2011 |
| JP | 2012186314 A | 9/2012 |
| JP | 2012256733 A | 12/2012 |
| KR | 101364744 B1 | 2/2014 |
| WO | 2010000812 | 1/2010 |
| WO | 2016063244 | 4/2016 |

* cited by examiner

| 6 | 22 |
|---|---|

| 6 | 22 |
|---|---|

METHOD AND DEVICE FOR PRODUCING SOLAR PANELS

CROSS-REFERENCE TO RELATED APPLICATIONS

This application is a 371 National Phase of PCT/EP2021/087147, filed Dec. 21, 2021, which claims priority from German Patent Application No. 10 2021 105 986.0, filed Mar. 11, 2021, the entire contents of which are incorporated herein by reference as if fully set forth.

TECHNICAL FIELD

The invention relates to a method and a device for producing solar modules.

BACKGROUND

Such methods and devices are known from practice. In this case, photovoltaic cells are assembled into rows and the solar modules are constructed from electrically interconnected rows.

SUMMARY

The object of the invention is to provide a method for producing solar modules and a corresponding device which are conducive to the efficient production of solar modules.

First proposed to achieve the object is a method comprising one or more of the means and features disclosed herein directed to a method for producing solar modules. In particular, for achieving the object, it is thus proposed in the case of the method mentioned above that at least two rows are built up and that the at least two rows are co-fed to a cell-fitting operation for the solar module.

The co-feeding, in particular simultaneous feeding, of at least two or more rows allows the cell-fitting operation for the solar module to take place in a shorter time, which is conducive to more efficient production of solar modules.

The at least two rows may be co-fed to the cell-fitting operation for the solar module by means of a motorized transfer unit, for example by means of a tray and/or by means of a vacuum table and/or a belt conveyor. The use of a motorized transfer unit can be conducive to the largely or even completely automated production of solar modules.

For fitting the rows into the solar module without changing an arrangement of the photovoltaic cells in the rows produced during the building up of the rows, it is advantageous if a relative alignment of the photovoltaic cells within one row and/or within two different rows is maintained during the feeding.

In the finished solar module there may be an electrical voltage level within each of the individual rows of photovoltaic cells. There is therefore no electrical voltage build-up in the longitudinal direction of the rows across the photovoltaic cells of a row. In the finished solar module there may be an electrical voltage build-up across the electrically interconnected rows, and thus transversely or at right angles to a longitudinal direction of the rows.

According to the method, the photovoltaic cells can thus be assembled into rows, with an electrical voltage level within each of the individual rows of photovoltaic cells. The solar modules can then be constructed from electrically interconnected rows, with an electrical voltage build-up taking place in the solar module across the electrically interconnected rows, and thus transversely or at right angles to a longitudinal direction of the rows.

For the purposes disclosed herein, a row can thus be distinguished from a conventional string of photovoltaic cells. In a string, the photovoltaic cells are electrically interconnected in such a way that an electrical voltage build-up takes place in the longitudinal direction of the string across the electrically interconnected photovoltaic cells of the string.

For the electrical connection of photovoltaic cells within a row and/or of photovoltaic cells of different, in particular adjacent, rows, an electrically conductive adhesive may be applied to the photovoltaic cells.

In order to prevent a bead of adhesive from tearing off when applying the electrically conductive adhesive to a row of photovoltaic cells, it may be advantageous to adapt a number of co-fed rows to an application rate of an electrically conductive adhesive. In particular, when photovoltaic cells are arranged in at least two rows by means of a transfer unit, a maximum feed or transfer rate, with which the rows are co-fed to the cell-fitting operation for the solar cell, may be limited by the cycle time of the transfer unit in the arrangement of the photovoltaic cells.

The higher the number of rows that are co-fed, the lower a feed or transfer rate at which the at least two rows can be fed to the cell-fitting operation can be. If the electrically conductive adhesive is to be applied during the feeding of at least two rows of photovoltaic cells to the cell-fitting operation for the solar module, for example by a relative movement of the rows during their feeding to the cell-fitting operation for the solar module in relation to a dispensing unit, with which adhesive is dispensed, it may thus be expedient to adapt a number of co-fed rows to the application rate of the electrically conductive adhesive in order to make the application of the electrically conductive adhesive reliable within the process.

If the application rate of the electrically conductive adhesive in turn is variable, the application rate of the electrically conductive adhesive can also be adapted to a number of co-fed rows.

In one embodiment of the method it is provided that a first group of co-fed rows in a first cycle phase are fed at a first vertical distance from a dispensing unit for electrically conductive adhesive and a second group of co-fed rows are then fed at a second vertical distance from the dispensing unit, which is different from the first vertical distance. In this embodiment of the method there may therefore be two transfer levels in which different groups of co-fed rows are fed to the cell-fitting operation for solar modules. These transfer levels may be arranged here one vertically above the other, so that the transfer levels have different vertical distances from a dispensing point, for example, a dispensing unit, for electrically conductive adhesive onto the co-fed rows.

In order to create conditions that are conducive for connecting adjacent rows, electrically conductive adhesive may be applied with a lateral offset in relation to a longitudinal central axis of a row of photovoltaic cells to a row. In this way, two adjacent rows can be adhesively bonded to one another while mutually overlapping.

Also proposed to achieve the object is a method for producing solar modules of the type mentioned at the beginning which comprises one or more of the features directed to such a method. To achieve the object, in the case of the method defined at the beginning it is thus proposed in particular that offsetting elements are used during the building up of the rows to form an offset of adjacent rows in relation to one another.

The offset of adjacent rows in relation to one another may be advantageous to produce a mechanically secure and stable connection between adjacent rows within a solar module.

The use of relatively offset rows of photovoltaic cells in a solar module offers the possibility of electrically connecting a photovoltaic cell of a row to multiple photovoltaic cells of the same and/or adjacent rows surrounding the photovoltaic cell on the solar module. This can lead to a solar module that is constructed in such a way that, even if one or more photovoltaic cells of the solar module are shaded, it provides a high performance.

If the offset of adjacent rows in relation to one another is already produced before the solar module is fitted with cells, when the rows of photovoltaic cells are being built up, handling of the rows when the solar module is fitted with cells can be made considerably easier. This can significantly increase the efficiency of the method in the production of solar modules.

It should be mentioned at this point that the use of such offsetting elements may also be useful in the case of the previously mentioned method which is characterized by one or more of the features disclosed herein.

Photovoltaic cells that have a shorter length and/or a different geometry compared to other photovoltaic cells of a row may be used for example as offsetting elements.

In one embodiment of the method, it may be provided that at least two rows offset in relation to one another are co-fed to the cell-fitting operation.

The photovoltaic cells that are assembled into rows may be so-called photovoltaic cell shingles.

In one embodiment of the method, groups of at least two rows are built up in parallel in time and are fed to a common cell-fitting operation. In this way, the number of co-fed rows can be increased by scaling the process.

Also proposed to achieve the object is a device for producing solar modules which has the means features of the independent claim directed to such a device. To achieve the object, in the case of the device defined at the beginning it is thus proposed in particular that this device has means by which the device is set up for carrying out the method according to one of the claims direct to a method for producing solar modules.

In one embodiment of the device it may be provided that it has a motorized transfer unit, with which at least two rows of photovoltaic cells can be co-fed to a cell-fitting operation for a solar module to be produced.

A tray, a conveyor table, in particular with a vacuum table, a belt conveyor, in particular with a vacuum table and/or a vacuum table may serve for example as a motorized transfer unit. With the aid of a vacuum table, it is possible to use a vacuum to fix photovoltaic cells arranged in rows on the vacuum table during the feeding to the cell-fitting operation. Fixing photovoltaic cells by means of a vacuum is particularly gentle and can help to reduce or even completely avoid waste in the production of solar modules.

The motorized transfer unit may be set up to move the photovoltaic cells of the rows from a loading point to an unloading point, at which the rows of photovoltaic cells are removed from the transfer unit for fitting into a solar module.

At the transfer unit, at least two support positions for each row of photovoltaic cells may be formed and/or defined. In this way, it is possible with the transfer unit to co-feed at least two rows of photovoltaic cells to a cell-fitting operation for solar modules.

In the case of a preferred embodiment of the device, the transfer unit may have at least one series of suction openings for each support position. In this way, rows of photovoltaic cells arranged on the at least two support positions of the transfer unit can be fixed on the transfer unit by means of a vacuum.

The device may comprise a vacuum generating unit, with which rows of photovoltaic cells can be fixed on the transfer unit by a vacuum, in particular during the co-feeding of at least two rows to the cell-fitting operation for a solar module. As already previously mentioned, the use of vacuum to fix the rows allows particularly gentle, and therefore efficient, fixing of photovoltaic cells during their feeding on the transfer unit.

The vacuum generating unit may be connected here to suction openings of the transfer unit. The vacuum generated by the vacuum generating unit can be transferred to the rows of photovoltaic cells via the suction openings of the transfer unit.

The device may also have a dispensing unit for dispensing electrically conductive adhesive onto rows of photovoltaic cells. The dispensing unit may be arranged in such a way that dispensing of electrically conductive adhesive onto rows of photovoltaic cells that are arranged on the transfer unit is possible. The dispensing unit may for example be arranged between a loading point, at which the photovoltaic cells are arranged for the building up of rows on the previously mentioned transfer unit, and an unloading point, at which the rows are unloaded from the transfer unit. In this way, it is possible to apply the electrically conductive adhesive to the rows of photovoltaic cells with the aid of the dispensing unit by a relative movement between the dispensing unit and the transfer unit. The rows can thus be provided with electrically conductive adhesive during their transfer between the loading point and the unloading point. If necessary, here the relative movement may be the transfer movement of the rows.

The dispensing unit may have a number of dispensing nozzles corresponding to a number of support positions for rows of photovoltaic cells of the transfer unit. In this way it is possible to provide all of the rows of photovoltaic cells that are arranged on the transfer unit during the transfer with electrically conductive adhesive.

In one embodiment of the device it is provided that the dispensing unit, in particular at least one dispensing nozzle of the dispensing unit, from which electrically conductive adhesive can be applied to rows of photovoltaic cells is movable in the longitudinal direction of support positions of the transfer unit for rows, and thus in the longitudinal direction of rows arranged on the transfer unit. This allows electrically conductive adhesive to be applied to rows of photovoltaic cells that are fed to the cell-fitting operation with the aid of a transfer unit, wherein the transfer unit carries out a transfer movement that is aligned transversely or at right angles to the longitudinal direction of the rows of photovoltaic cells arranged on the transfer unit. Here, the movement of the dispensing unit, in particular its dispensing nozzles, may then be aligned transversely or correspondingly at right angles to the transfer movement of the transfer unit.

The device may have a magazine for providing photovoltaic cells. The magazine may for example comprise a conveying means, for example a conveyor belt, on which a supply of photovoltaic cells and/or offsetting elements can be moved into a removal position. This is conducive to particularly efficient and largely uninterrupted provision of photovoltaic cells for the production of solar modules.

The device may also have a transfer unit, in particular with a handling robot, for example a swivel-arm robot, with which photovoltaic cells can be arranged in rows on the transfer unit.

With the aid of the transfer unit, the photovoltaic cells and/or offsetting elements can for example be removed from the already previously mentioned magazine.

The transfer unit, in particular the previously mentioned handling robot, may have at least one suction gripper. With the aid of a suction gripper, photovoltaic cells can be gripped particularly gently and also released again.

For monitoring photovoltaic cells, the device may have a monitoring unit. The monitoring unit may comprise at least one optical monitoring means, for example a camera. In one embodiment of the device, the monitoring unit is provided between a magazine for providing photovoltaic cells and the transfer unit, in particular between the magazine for providing photovoltaic cells and the already previously mentioned transfer unit of the device, with which photovoltaic cells can be removed from the magazine and arranged in rows on the transfer unit. This allows the photovoltaic cells taken out of the magazine to be checked before they are arranged in rows on the transfer unit.

The magazine may comprise at least one belt conveyor, with which the photovoltaic cells can be brought into a removal position.

The device may also have a cell-fitting unit, in particular with at least one gripper, preferably with at least one suction gripper. The cell-fitting unit may be adapted to receive at least one or more or all of the rows of photovoltaic cells which are provided by the transfer unit at a unloading point and/or to transfer them to a downstream processing step and/or handling step, in particular to a downstream transporting unit of the device. With the aid of the cell-fitting unit, it is possible to fit the rows of photovoltaic cells provided by the transfer unit into the solar module.

The device may have a transporting unit downstream of the transfer unit. With the aid of the transporting unit, at least one solar module fitted with rows of photovoltaic cells can be fed to a downstream processing station. A downstream processing station may for example be an oven in which electrically conductive adhesive which can be used to connect the rows of photovoltaic cells of a module to one another is cured. A downstream processing station may also be for example a packaging and/or loading station. For example, a layup, which may be set up for matrix transfer, may be used as a packaging and/or loading station.

In one embodiment of the device it is provided that a transfer movement of the transfer unit is aligned transversely, in particular at right angles, to a longitudinal direction of support positions for rows of photovoltaic cells on the transfer unit or in the longitudinal direction of support positions for rows on the transfer unit.

In one embodiment of the device it is provided that a transfer movement of the transfer unit is aligned transversely, in particular at right angles, to a transporting movement of the transporting unit. In the case of another embodiment of the device it is provided that a transfer movement of the transfer unit is aligned in the direction of a transporting movement of the transporting unit. In this embodiment of the device, it may be advantageous if the previously mentioned dispensing unit, at least at least one dispensing nozzle of the dispensing unit, with which electrically conductive adhesive can be applied to the rows of photovoltaic cells can be moved relative to the transfer unit and in the longitudinal direction of the support positions for rows, and thus in the longitudinal direction of the rows of photovoltaic cells that are arranged on the transfer unit, and/or relative to the transfer unit and/or transversely or at right angles to the support positions and/or rows of photovoltaic cells.

The device may have a controller, by which the device is set up for carrying out the method in accordance with one of the claims directed to such a method.

BRIEF DESCRIPTION OF THE DRAWINGS

The invention is described in more detail below with reference to exemplary embodiments, but is not limited to the exemplary embodiments shown. Further exemplary embodiments result from the combination of the features of one or more claims among themselves and/or in combination of one or more features of the exemplary embodiments.

In the figures.

DETAILED DESCRIPTION

Figure 1:
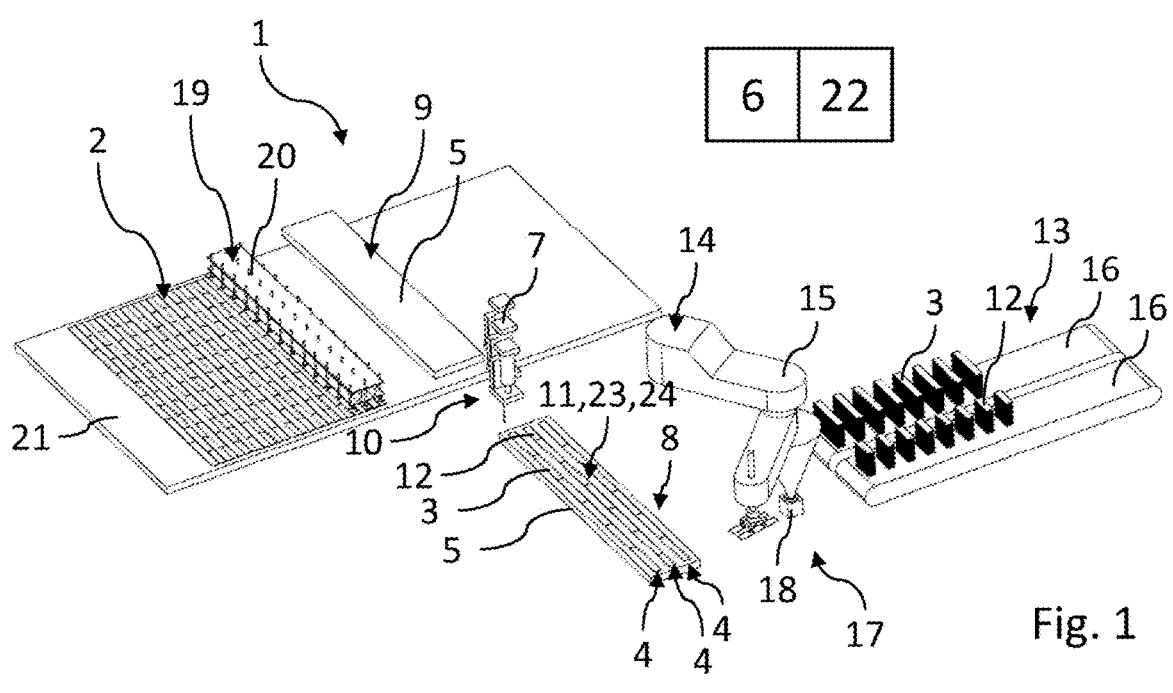
FIGS. 1 and 2 show a first exemplary embodiment of a device for producing solar modules, wherein the device has a transfer unit in the form of a movable vacuum table, which may also be referred to as a tray, with which a total of three rows of photovoltaic cells can be co-transferred into an unloading position for the operation of fitting the rows into a solar module.

In the following description of different embodiments of the invention, elements that have the same function are given the same reference numerals, even if they differ in their design or shape.

All of the figures show in each case a device for producing solar modules 2 that is denoted overall by 1.

Each device 1 has means by which the device 1 is set up for carrying out the method described below for producing solar modules 2.

Here, photovoltaic cells 3 are assembled into rows 4 and solar modules 2 are constructed from the then electrically interconnected rows 4.

In the method it is provided that at least two rows 4, in the case of the examples shown in the figures at least three rows 4, are built up and that the rows 4 are then co-fed to a cell-fitting operation for a solar module 2.

In the case of all of the embodiments of devices 1 shown in the figures, the rows 4 are co-fed to the cell-fitting operation for the solar module 2 by means of in each case a motorized transfer unit 5.

Figure 2:
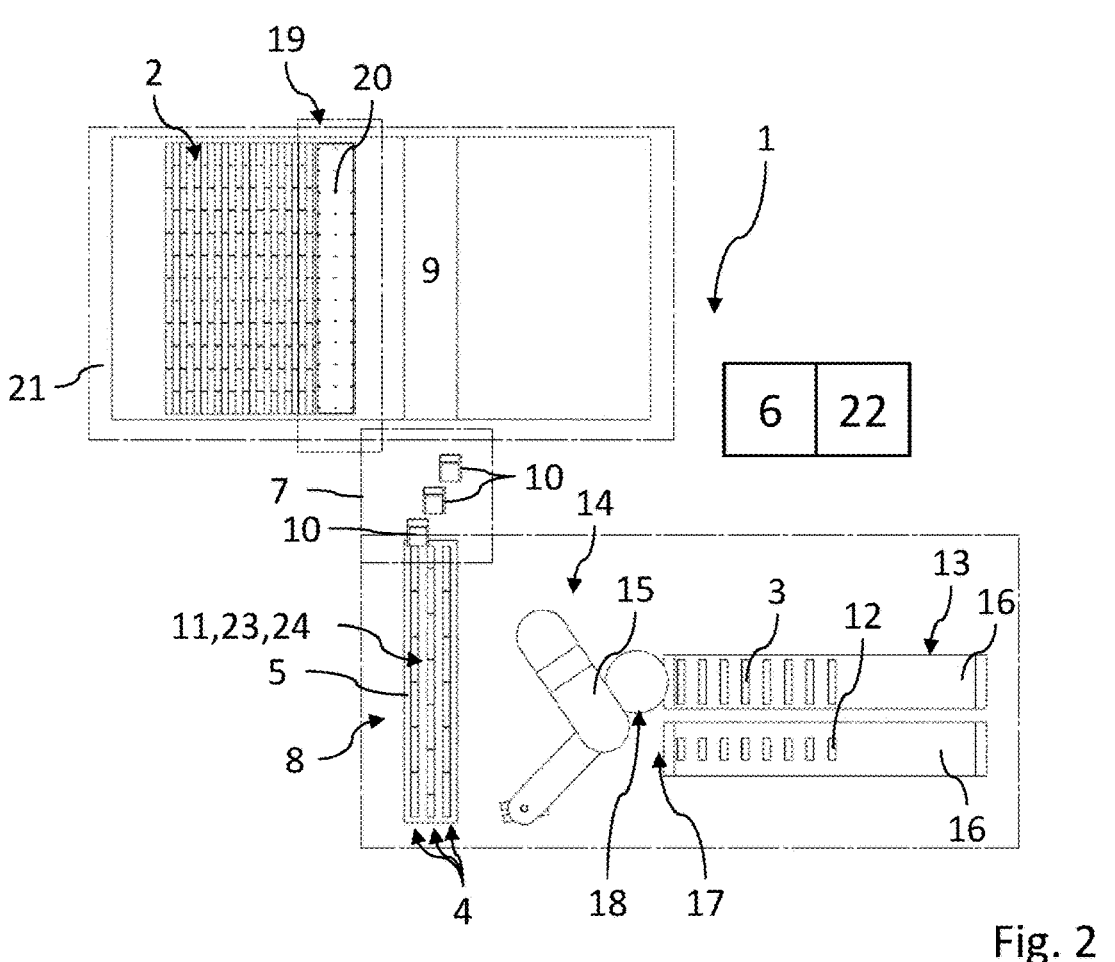

In the case of the exemplary embodiment of such a device 1 shown in FIGS. 1 and 2, a vacuum table, which is movable between a loading point 8 and an unloading point 9, is used as the transfer unit 5.

Figures 3, 4:
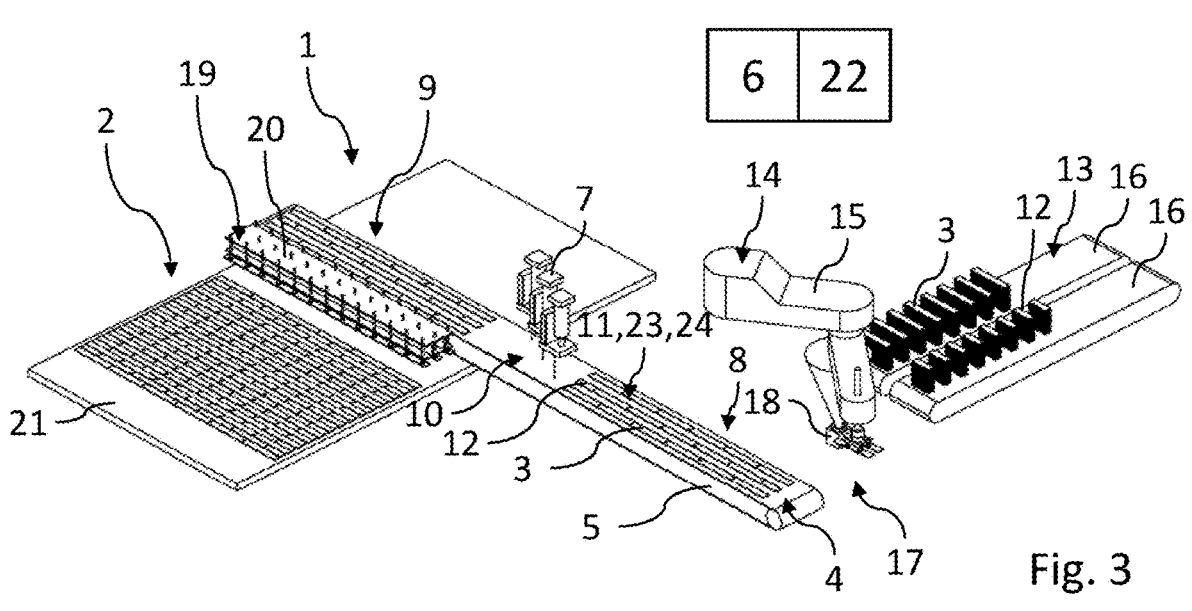
FIGS. 3 and 4 show a second exemplary embodiment of a device for producing solar modules, wherein here a transfer unit of the device, with which three rows of photovoltaic cells can be co-fed to the cell-fitting operation for a solar module, is designed as a belt conveyor.

The device 1 shown in FIGS. 3 and 4 has a belt conveyor as the transfer unit 5. By the transfer movement of the belt conveyor, the rows 4 which are built up on the belt conveyor can be co-fed to the cell-fitting operation for the solar module 2.

Figure 5:
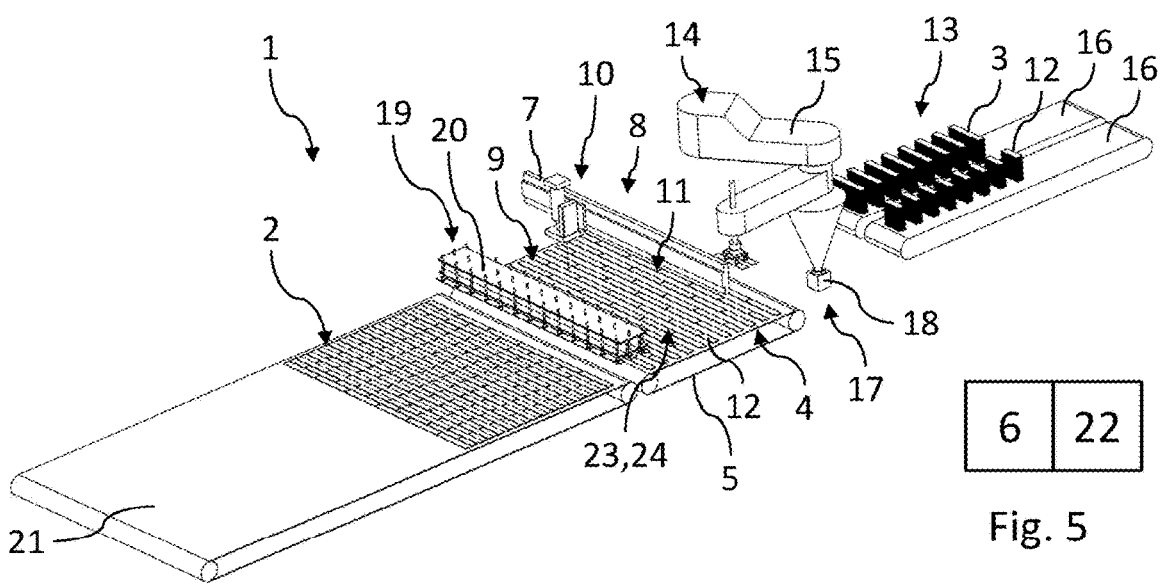
FIGS. 5 and 6 show a third exemplary embodiment of a device for producing solar modules, wherein this device likewise has a transfer unit in the form of a belt conveyor, wherein, however, a transfer movement of the transfer unit is aligned transversely, specifically at right angles, to the orientation of the rows of photovoltaic cells arranged on the transfer unit.
Figure 6:
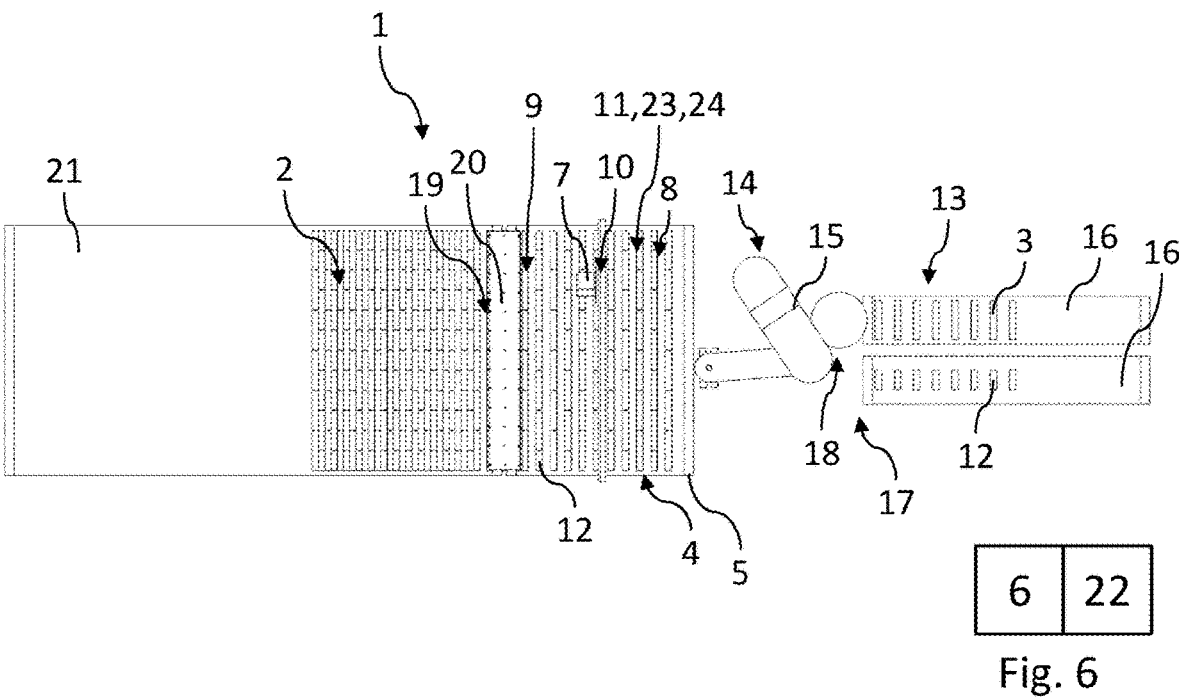

The device 1 shown in FIGS. 5 and 6 is likewise equipped with a transfer unit 5, which is designed as a belt conveyor.

While in the case of the device 1 shown in FIGS. 3 and 4 a transfer movement of the transfer unit 5 takes place in the longitudinal direction of the rows 4 arranged on the transfer unit 5, the transfer movement of the transfer unit 1 of the device 1 shown in FIGS. 5 and 6 is aligned transversely, specifically at right angles, to the longitudinal direction of the rows 4 of photovoltaic cells 3 built up on the transfer unit 5.

In the method, which can be carried out on all three exemplary embodiments of devices 1 shown, it is provided that a relative alignment of the photovoltaic cells 3 within a row 4, and also of the rows 4 that are built up on the transfer unit 5 to one another, is maintained during the feeding.

A number of co-fed rows 4 is adapted here to an application rate of an electrically conductive adhesive. The electrically conductive adhesive is applied to the rows 4 of photovoltaic cells 3 in order to connect the photovoltaic cells 3 and rows 4 mechanically and electrically to one another. The application of the electrically conductive adhesive to a row 4 of photovoltaic cells 3 can be carried out with a lateral offset in relation to the longitudinal central axis of a respective row 4.

Each of the devices 1 shown in the figures has in each case a vacuum generating unit 6, with which rows 4 of photovoltaic cells 3 can be fixed at least temporarily on the respective transfer unit 5 by a vacuum. The vacuum generating units 6 are only shown in the figures in a highly schematized form.

Each device 1 shown also has a dispensing unit 7 for dispensing electrically conductive adhesive onto rows 4 of photovoltaic cells 3 that are arranged on the transfer unit 5.

The dispensing units 7 of the devices 1 are in each case arranged between the already previously mentioned loading point 8 and the likewise previously mentioned unloading point 9 of rows 4.

The dispensing units 7 of the device 1 shown in FIGS. 1 and 2 and also 3 and 4 have a number of dispensing nozzles 10, which corresponds to a number of support positions 11 for rows 4 of photovoltaic cells 3 on the transfer unit 5. Consequently, the dispensing units 7 of the devices 1 shown in FIGS. 1-4 thus have in each case three dispensing nozzles 10. Vertical projections of the dispensing nozzles 10 onto support positions 11 for photovoltaic cells 2 arranged at least temporarily under them on the transfer units 5 may have a lateral offset in relation to the longitudinal central axes of the support positions 11. This allows the application of electrically conductive adhesive onto the rows 4 with a lateral offset in relation to a longitudinal central axis of the rows 4.

The vacuum generating units 6 of the devices 1 are connected to suction openings 23, which the respective transfer unit 5 has. Each transfer unit 5 has at least one series 24 of such suction openings 23 respectively for each of its support positions 11. In this way, the rows 4 of photovoltaic cells 3 can be reliably fixed on the transfer units 5 during their feeding.

In the case of the exemplary embodiment of a device 1 for producing solar modules 2 shown in FIGS. 5 and 6, the dispensing unit 7 has a dispensing nozzle 10, which is movable in the longitudinal direction of rows 4 of photovoltaic cells 3 arranged on the transfer unit 5. By the movement of the dispensing nozzle 10 along the rows 4 arranged on the transfer unit 5, the electrically conductive adhesive can be dispensed row by row onto the rows 4 at least temporarily arranged under the dispensing unit 7. A track along which the dispensing nozzle 10 can be movable during the dispensing of electrically conductive adhesive may have here a lateral offset in relation to a longitudinal central axis of a row 4 to be provided with electrically conductive adhesive.

During the dispensing of electrically conductive adhesive, the position of the dispensing nozzle 10 can be kept constantly transverse to the longitudinal extent of the row 4 to be provided with electrically conductive adhesive. It may be provided in this context that the dispensing nozzle 10 is movable synchronously with the transfer unit 5 in the direction of the transfer movement of the transfer unit 5.

In the case of all of the devices 1 shown in the figures, offsetting elements 12 are used during the building up of the rows 4 to produce an offset of adjacent rows 4 first on the respective transfer unit 5 and later also on the finished solar module 2.

The offsetting elements 12 are photovoltaic cells that have a shorter length compared to other photovoltaic cells which are denoted in the figures by 3 and are not designed as offsetting elements 12.

The figures show that at least two, specifically three or even more, rows 4 offset in relation to one another are co-fed to the cell-fitting operation for a solar module 2.

In one embodiment of the method, groups of at least two rows 4 can be built up in parallel in time and these are co-fed to a common cell-fitting operation. One of the transfer units 5 shown in the figures can also be used for this purpose.

For the provision of the photovoltaic cells 3 and the offsetting elements 12, each of the devices 1 shown in the figures has a magazine 13. With the aid of a transfer unit 14, which has a handling robot 15, specifically a swivel-arm robot, the offsetting elements 12 and photovoltaic cells 3 stored and provided in the respective magazine 13 can be removed and arranged in rows 4 on the respective transfer unit 5. Each magazine 13 has a total of two conveyor belts 16, on which on the one hand the offsetting elements 12 and on the other hand the in comparison slightly longer, regular photovoltaic cells 3 are stored, arranged in stacks.

For monitoring photovoltaic cells 3 and also offsetting elements 12, each device 1 has a monitoring unit 17. The monitoring units 17 are arranged between the magazine 13 and the transfer unit 14 of the respective device 1 and comprise in each case at least one optical monitoring means, for example a camera 18.

With the aid of the handling robot 15 of the transfer unit 14, the photovoltaic cells 3 and/or offsetting elements 12 taken from the magazine 13 can be presented to the camera 18 of the monitoring unit 17, in order to check the photovoltaic cells 3 and offsetting elements 12 before their arrangement on the respective transfer unit 5. Downstream of the respective transfer unit 5 and also the unloading point 9, each of the devices 1 has a cell-fitting unit 19. Each cell-fitting unit 19 comprises a number of grippers 20, which are designed as suction grippers.

The cell-fitting units 19 are set up to receive one or more or even all of the rows 4 of photovoltaic cells 3 which are provided by the respective transfer unit 5 at the unloading point 9 and to transfer them to a downstream transporting unit 21 of the respective device 1. The respective transporting unit 21 serves for feeding at least one solar module 2 fitted with rows 4 of photovoltaic cells 3 to a downstream processing station, for example an oven.

As already previously mentioned, a transfer movement of the transfer unit 5 of the devices 1 shown in FIGS. 1-4 is aligned in the longitudinal direction of support positions 11, and thus also in the longitudinal direction of rows 4 on the transfer unit 5.

In the case of the exemplary embodiment of the device 1 shown in FIGS. 5 and 6, the transfer movement of the transfer unit 5 is aligned transversely, specifically at right angles, to a longitudinal direction of support positions 11, and thus transversely, specifically at right angles, to a longitudinal direction of the rows 4 that are arranged on the support positions 11 of the transfer unit 5.

The transfer movements of the transfer unit 5 of the devices 1 shown in FIGS. 1-4 are aligned transversely, specifically at right angles, to the transporting movement of the respective transporting unit 21, which is downstream of the transfer unit 5.

In the case of the exemplary embodiment of the device 1 shown in FIGS. 5 and 6, the transfer movement of the transfer unit 5 is aligned in the direction of a transporting movement of the transporting unit 21 used there.

Like the transfer unit 5, the transporting unit 21 of the device 1 shown in FIGS. 5 and 6 is designed as a belt conveyor.

For carrying out the previously described method, each of the devices 1 shown in the figures also has a controller 22. By this controller 22, the previously mentioned functional units of the respective device 1 can be actuated as provided in the method.

The invention relates to improvements in the technical field of the production of solar modules. Proposed inter alia for this purpose is a method for producing solar modules 2 in which at least two or more rows 4 of photovoltaic cells 3 are co-fed to a cell-fitting operation for a solar module 2.

LIST OF REFERENCE NUMERALS

1 Device
2 Solar module
3 Photovoltaic cell
4 Row
5 Transfer unit
6 Vacuum generating unit
7 Dispensing unit
8 Loading point
9 Unloading point
10 Dispensing nozzle
11 Support position
12 Offsetting element
13 Magazine
14 Transfer unit
15 Handling robot
16 Conveyor belt
17 Monitoring unit
18 Camera
19 Cell-fitting unit
20 Gripper
21 Transporting unit
22 Controller
23 Suction opening
24 Series of 23

The invention claimed is:

1. A method for producing solar modules (2), the method comprising:
   assembling photovoltaic cells (3) into rows (4);
   constructing the solar modules (2) from electrically inter-connected ones of the rows (4);
   building up at least two of the rows (4) so that the at least two rows are offset in relation to one another and co-feeding the at least two rows (4) to a cell-fitting operation for the solar module (2);
   using offsetting elements (12) during the building up of the at least two rows (4) to form the offset of adjacent ones of the rows (4) in relation to one another; and
   for connecting adjacent ones of the rows (4) of the photovoltaic cells (3), applying electrically conductive adhesive with a lateral offset in relation to a longitu-dinal central axis of one said row (4) of the photovoltaic cells (3) to the row (4), after which two adjacent ones of the rows (4) are adhesively bonded to one another while mutually overlapping.

2. The method as claimed in claim 1, wherein the at least two rows (4) are co-fed to the cell-fitting operation for the solar module (2) by a motorized transfer unit (5).

3. The method as claimed in claim 1, further comprising maintaining a relative alignment of the photovoltaic cells (3) within at least one of one said row (4) or two different ones of the rows (4) during the co-feeding.

4. The method as claimed in claim 1, wherein at least one of a) a number of co-fed ones of the rows (4) is adapted to an application rate of the electrically conductive adhesive or b) the application rate of the electrically conductive adhesive is adapted to a number of the co-fed rows.

5. The method as claimed in claim 1, wherein groups of at least two of the rows (4) are built up in parallel in time and are fed to a common cell-fitting operation.

6. A device (1) for producing solar modules (2) according to the method of claim 1, the device (1) comprising:
   a motorized transfer unit (5), with which the at least two rows (4) of the photovoltaic cells (3) are co-fed to the cell-fitting operation for the solar module (2) to be produced;
   a dispensing unit (7) for dispensing the electrically con-ductive adhesive onto the rows (4) of the photovoltaic cells (3); and
   a controller (22) configured to operate the motorized transfer unit and the dispensing unit for carrying out the method as claimed in claim 1.

7. The device (1) as claimed in claim 6, wherein the motorized transfer unit (5) comprises at least one of a tray, a table, a belt conveyor, or a vacuum table, and the motor-ized transfer unit (5) is configured to move the photovoltaic cells (3) of the rows (4) from a loading point (8) to an unloading point (9).

8. The device (1) as claimed in claim 7, wherein the transfer unit (5) comprises at least two support positions (11) for the rows (4) of the photovoltaic cells (3), and at least one row (24) of suction openings (23) for each of the support positions (11).

9. The device (1) as claimed in claim 8, further compris-ing a vacuum generating unit (6), with which the rows (4) of the photovoltaic cells (3) are fixable on the transfer unit (5) by a vacuum, and the vacuum generating unit (6) is con-nected to the suction openings (23) of the transfer unit (5).

10. The device (1) as claimed in claim 6, wherein the dispensing unit (7) is adapted to dispense electrically con-ductive adhesive onto the rows (4) of the photovoltaic cells (3) that are arranged on the transfer unit (5), and the dispensing unit (7) is arranged between a loading point (8) and an unloading point (9) of the device (1) for the rows (4).

11. The device (1) as claimed in claim 10, wherein the dispensing unit (7) has a number of dispensing nozzles (10) which corresponds to a number of support positions (11) for the rows (4) of the photovoltaic cells (3) of the transfer unit (5), and at least the dispensing nozzles (10) of the dispensing unit (7) are movable in a longitudinal direction of the rows (4) arranged on the transfer unit (5).

12. The device (1) as claimed in claim 6, further comprising a magazine (13) for providing the photovoltaic cells (3).

13. The device (1) as claimed in claim 12, further comprising a transfer unit (14) with which the photovoltaic cells (4) are removed from the magazine (13) and arranged in the rows (3) on the transfer unit (5).

14. The device (1) as claimed in claim 6, further comprising a monitoring unit (17) for monitoring the photovoltaic cells (3), the monitoring unit (17) comprising at least one optical sensor.

15. The device (1) as claimed in claim 6, further comprising a cell-fitting unit (19) with at least one gripper (20), the cell-fitting unit (19) is set up to receive at least one or more of the rows (4) of the photovoltaic cells (3) which are provided by the transfer unit (5) at an unloading point (9)

and to transfer the at least one or more of the rows (4) to at least one of a downstream processing step or handling step.

16. The device (1) as claimed in claim 6, further comprising a transporting unit (21) downstream of the transfer unit (5), with which at least one of the solar modules (2) fitted with the rows (4) of the photovoltaic cells (3, 12) is fed to a downstream processing station.

17. The device (1) as claimed in claim 6, wherein a transfer movement of the transfer unit (5) is aligned transversely to a longitudinal direction of support positions (11) for the rows (4) on the transfer unit (5) or in the longitudinal direction of the support positions (11) for the rows (4) on the transfer unit (5).

18. The device (1) as claimed in claim 6, wherein a transfer movement of the transfer unit (5) is aligned transversely to a transporting movement of the transporting unit (21) or in a direction of a transporting movement of the transporting unit (21).

*   *   *   *   *